(12) United States Patent
Kalb

(10) Patent No.: US 6,262,434 B1
(45) Date of Patent: Jul. 17, 2001

(54) INTEGRATED CIRCUIT STRUCTURES AND METHODS TO FACILITATE ACCURATE MEASUREMENT OF THE IC DEVICES

(75) Inventor: Jeffrey C. Kalb, Saratoga, CA (US)

(73) Assignee: California Micro Devices Corporation, Milpitas, CA (US)

( * ) Notice: Subject to any disclaimer, the term of this patent is extended or adjusted under 35 U.S.C. 154(b) by 0 days.

(21) Appl. No.: 08/914,309

(22) Filed: Aug. 18, 1997

Related U.S. Application Data (60) Provisional application No. 60/024,478, filed on Aug. 23, 1996.

(51) Int. Cl.[7] .............................. H01L 23/58; H01L 29/00
(52) U.S. Cl. ........................... 257/48; 257/530; 257/537; 438/4; 438/384; 338/114; 338/140; 338/195; 338/319; 338/320
(58) Field of Search ..................................... 438/382, 384, 438/617, 4; 257/484, 530, 775, 48, 723, 724, 536, 537, 538; 29/610.1; 338/295, 319, 320, 195, 114, 140

(56) References Cited

U.S. PATENT DOCUMENTS

| | | | |
|---|---|---|---|
| 3,533,160 | 10/1970 | Cunningham et al. | 29/578 |
| 3,766,308 | * 10/1973 | Loro | 174/68.5 |
| 4,275,404 | 6/1981 | Cassiday et al. | 357/19 |
| 4,298,856 | * 11/1981 | Schuchardt | 338/195 |
| 4,530,001 | 7/1985 | Mori et al. | 357/49 |
| 4,929,923 | * 5/1990 | Dharmadhikari | 338/195 |
| 4,939,616 | 7/1990 | Rountree | 361/56 |
| 5,268,589 | 12/1993 | Dathe | 257/577 |
| 5,298,790 | 3/1994 | Harmon et al. | 257/622 |
| 5,309,020 | * 5/1994 | Murasawa et al. | 257/724 |
| 5,451,814 | * 9/1995 | Yoshimizu | 257/723 |
| 5,502,885 | * 4/1996 | Hanamura et al. | 338/195 |
| 5,547,896 | * 8/1996 | Linn et al. | 437/60 |
| 5,559,054 | * 9/1996 | Adamjee | 437/183 |
| 5,675,179 | * 10/1997 | Shu et al. | 257/48 |
| 5,683,928 | * 11/1997 | Wojnarowski et al. | 438/382 |
| 5,834,843 | * 11/1998 | Mori et al. | 257/723 |
| 5,849,623 | * 12/1999 | Wojnarowski et al. | 438/382 |

FOREIGN PATENT DOCUMENTS

| | | | |
|---|---|---|---|
| 29 42 394 A1 | 8/2000 | (DE) | H01L/23/50 |
| 60176217 | 2/1987 | (JP) | H01L/21/60 |

OTHER PUBLICATIONS

European Search Report (Mar. 6, 2001).

* cited by examiner

*Primary Examiner*—Ngân V. Ngô
(74) *Attorney, Agent, or Firm*—Beyer Weaver & Thomas LLP (57) ABSTRACT

The present invention relates, in one embodiment, to an integrated circuit including a first circuit structure, a first conductive bonding pad coupled to the first circuit structure, a second circuit structure, and a second conductive bonding pad coupled to the second circuit structure. The first conductive bonding pad is arranged to be separated from the second bonding pad by a gap having a gap dimension. The gap dimension is configured to be bridged by a wire bond, thereby permitting the wire bond to electrically couple the first conductive bonding pad with the second conductive bonding pad when the wire bond is coupled to the first bonding pad and the second bonding pad at the gap.

14 Claims, 6 Drawing Sheets

INTEGRATED CIRCUIT STRUCTURES AND METHODS TO FACILITATE ACCURATE MEASUREMENT OF THE IC DEVICES

This application claims priority under 35 U.S.C 119 (e) of a provisional application entitled "Improved Integrated Circuit Structures And Methods To Facilitate Accurate Measurement Of The IC Devices" filed Aug. 23, 1996 by inventor Jeffrey C. Kalb (application Ser. No. 60/024,478)

BACKGROUND OF THE INVENTION

The present invention relates generally to the manufacture of integrated circuits (IC's). More particularly, the present invention relates to new integrated circuit (IC) structures, and methods therefor, that permit individual devices of the IC to be accurately measured while minimizing the IC's overall manufacturing complexity and cost.

Integrated circuits (IC's) and manufacturing techniques therefor are well known in the art. An IC comprises generally of a circuit or groups of circuits, each of which are formed of interconnected devices fabricated on a semiconductor substrate. Typically, the devices are fabricated in batch, i.e., similar devices are formed together in one or more conventional semiconductor processing steps. Once fabricated on the semiconductor die, the circuit(s) may then be bonded to a leadframe, whose pins provide terminals for inputs, outputs, Vcc, ground, and the like.

In some applications, the accuracy of each individual device of the circuit is of paramount importance. Such circuits are precise in nature and require their constituent devices to be within narrowly defined tolerance limits. By way of example, the resistance values of individual resistors in a resistor-divider network need to be tightly controlled in order for the resistor-divider network to provide a reasonably accurate voltage ratio.

Figure 1:
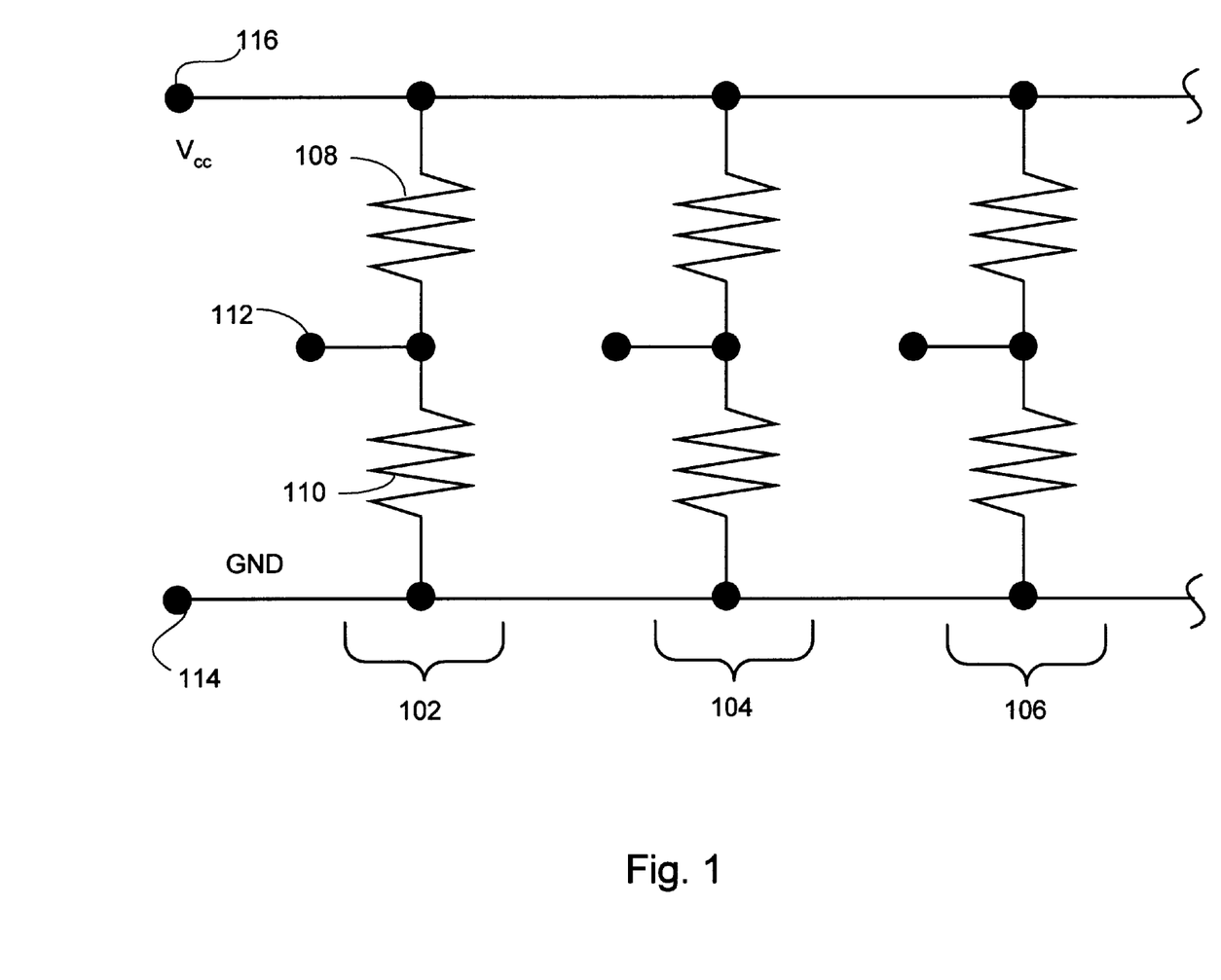
FIG. 1 illustrates a plurality of resistor networks known as Thevenin Equivalent Terminator circuits.

To facilitate discussion, FIG. I illustrates a plurality of thin film resistor networks known as Thevenin Equivalent Terminator circuits. Each resistor network is formed of interconnected devices representative of the type that may be fabricated using a conventional semiconductor processing technique. Although only three thin film resistor networks 102, 104, and 106 are shown in FIG. 1, a Thevenin Equivalent Terminator IC may contain any number of interconnected resistor networks, e.g., 12, 18, or even more depending on needs. It should also be borne in mind that although resistor networks are employed herein to simplify the illustration, the inventive concept is not limited to these types of IC's and applies equally well to other types of IC's that require accurate measurements of its constituent devices.

Within resistor network 102, thin-film resistors 108 and 110 are shown coupled in series between Vcc and ground. At the junction of resistors 108 and 110, an input terminal 112 is defined. As is apparent, resistor network 102 forms a resistor-divider circuit to provide a voltage ratio of supply voltage Vcc at input terminal 112. Resistor network 102 may be employed as, for example, a precise equivalent termination resistor for a bus that couples to input terminal 112.

In order to ensure the accuracy of resistor network 102, the resistance values of individual resistors 108 and 110 need to be tightly controlled. If the fabrication process is highly accurate, individual resistors 108 and 110 would be fabricated to their specified resistance values, rendering any post-fabrication adjustment of their resistance values unnecessary. For some precise thin-film resistor networks, however, it has been found that contemporary IC fabrication techniques do not have the degree of accuracy necessary to produce resistors with sufficiently precise resistance values. Consequently, the fabrication steps are employed to produce thin-film resistors having roughly the specified resistance values. Post-fabrication processing steps are subsequently performed on the fabricated resistors to bring them within the required tolerance limit.

To obtain the required degree of accuracy, each individual resistor in the Thevenin Equivalent Terminator of FIG. 1 may be fabricated to a lower resistance value than is intended in the final circuit, e.g., the cross-section area of each resistor's resistive portion is fabricated to be slightly larger than required for its intended resistance value. As part of the fabrication process, the resistors are connected together to form the desired resistive networks, complete with bonding pads to connect the resistive network to the appropriate pins of the IC package.

During wafer testing of the die, the value of each resistor is then measured in an appropriately designed testing apparatus. Depending on the measured value, a laser trimming apparatus is employed to trim away an appropriate amount of resistive material from the measured resistor body to reduce the resistor body's cross-sectional area, thereby bringing its resistance value within the specified tolerance limit. The testing and trimming operations are typically performed for each resistor in order to ensure the precision of the resulting resistor network.

In the prior art, the measuring and trimming operations are performed during wafer sort, i.e., after the individual resistors have been interconnected into the resistor networks. After the individual resistors are interconnected to other resistors in final circuit form, however, it is difficult to accurately measure the resistance value of each individual resistor. For example, if measurement probes are placed at input terminal 112 and ground node 114 to measure the resistance value of resistor 110, a sneak path of current through resistor 108 (and through other resistors of the interconnected resistor networks of FIG. 1) will render that measurement inaccurate. Further, since other resistors of FIG. 1 are also fabricated by the same fabrication process that produces resistor 110, they also suffer from fabrication-related inaccuracies. As such, it is not possible to rely on their specified values to compute the actual resistance of resistor 110 when a measurement is taken across input terminal 112 and ground node 114. Since the resistance value of resistor 110 cannot be accurately measured after fabrication, it is not possible then to accurately ascertain the extent to which resistor 110 needs to be laser-trimmed in order to bring it within the specified tolerance.

One potential solution involves laying out and fabricating the devices of an IC such that they remain electrically disconnected from one another after the fabrication steps. Thereafter, measurement may be made and any necessary adjustment may be performed on each device. Once the devices are properly adjusted and brought within the required tolerance limit, a bonding wire may be employed to provide an electrical path to each individual device, thereby forming the desired circuit. If a circuit requires two thin-film resistors, for example resistor network 102 of FIG. 1, resistors 108 and 110 may be fabricated so that they form two individual, electrically disconnected devices after fabrication. After measurement and adjustment are performed, two bonding wires, i.e., one for each device, may be then employed to couple the ends of resistors 108 and 110 to input terminal 112.

While the above-discussed potential solution renders the accurate measurement of each device possible, there are drawbacks. For example, when multiple bonding wires and corresponding bonding steps are employed to interconnect the individual devices together into the final circuit, manufacturing complexities and costs increase. For circuits having a large number of interconnected devices, the additional number of bonding wires and bonding steps required to electrically couple all the individual devices together may render the resulting IC prohibitively difficult to layout and/or manufacture.

In view of the foregoing, improved integrated circuit structures and methods therefor are desired. In particular, it is desirable to form an improved integrated circuit structure that permits the individual devices to be accurately measured after fabrication while also permitting the devices to be efficiently assembled into the final circuit after measurements (and any necessary adjustments) are performed.

SUMMARY OF THE INVENTION

The present invention relates, in one embodiment, to an integrated circuit including a first circuit structure, a first conductive bonding pad coupled to the first circuit structure, a second circuit structure, and a second conductive bonding pad coupled to the second circuit structure. The first conductive bonding pad is arranged to be separated from the second bonding pad by a gap having a gap dimension. The gap dimension is configured to be bridged by a wire bond, thereby permitting the wire bond to electrically couple the first conductive bonding pad with the second conductive bonding pad when the wire bond is coupled to the first bonding pad and the second bonding pad at the gap.

In another embodiment, the present invention relates to a method for manufacturing an integrated circuit which includes forming a first circuit structure, and forming a second circuit structure. The method further includes forming a conductive layer which is coupled to the first circuit structure and the second circuit structure. The method further includes etching the conductive layer to form a first conductive bonding pad and a second conductive bonding pad.

The first conductive bonding pad is coupled to the first circuit structure. The second conductive bonding pad is coupled to the second circuit structure. The first conductive bonding pad is electrically isolated from the second conductive bonding pad by a gap having a gap dimension. The gap dimension is configured to be bridged by a wire bond, thereby permitting the wire bond to electrically couple the first conductive bonding pad with the second conductive bonding pad when the wire bond is coupled to the first bonding pad and the second bonding pad at the gap.

BRIEF DESCRIPTION OF THE DRAWINGS

Additional advantages of the invention will become apparent upon reading the following detailed description and drawings.

To facilitate discussion.

DETAILED DESCRIPTION OF THE INVENTION

An invention is described for new integrated circuit (IC) structures, and methods therefor, that permit individual devices of the IC to be accurately measured while minimizing the IC's overall manufacturing complexity and costs. In the following description, numerous specific details are set forth in order to provide a thorough understanding of the present invention. It will be obvious, however, to one skilled in the art, that the present invention may be practiced without some or all of the specific details. In other instances, well-known structure and techniques have not been described in detail in order not to unnecessarily obscure the present invention.

In accordance with one aspect of the present invention, it is observed that the feature size produced by conventional semiconductor processing techniques are typically orders of magnitude smaller than those involved in the bonding process. Accordingly, if the bonding pads of individual devices that need to be measured during manufacturing but need to be coupled together in the final circuit are laid out adjacent to one another and separated by one or more very small gaps, it is possible to bridge these gaps with a single bonding connection. In this manner, a single bonding wire and bonding step may be employed to both bridge the gaps between adjacent bonding pads and provide an electrical path thereto. This is possible since the gap formed by a conventional semiconductor processing technique may have a width of only a few microns or even below one micron, whereas a bonding connection may cover an area 100 microns or more across.

The gap itself may be formed during the same etching step that is employed to etch the metallization layer to form the interconnect structures, e.g., to form the bonding pads and interconnecting buses on the die. Advantageously, very little, if any, additional processing complexity is required to electrically isolate the devices from each other to facilitate accurate measurement. Moreover, the dimension of the gap that electrically isolates the devices from one another is chosen such that the adjacent bonding pads of the devices may be shorted together during bonding by the single bonding connection that is traditionally employed to provide an electrical path to the common node. Advantageously, no additional bonding wire or bonding step is required to bond the electrically-isolated devices together during bonding.

Note that the above-discussed advantages are a consequence of, among others, the layout technique of the present invention, which allows the processing capabilities of semiconductor manufacturing processes to be employed to full advantage to efficiently form small isolation gaps during fabrication between devices that must be measured individually during manufacturing but must also be coupled together in final form. Furthermore, the above advantages are a result of the recognition that the relative size and appropriate placement of the bonding connection relative to the gap between the adjacent bonding pads render it unnecessary to use multiple bonding wires and bonding steps to electrically couple to the individual bonding pads together and to a common node.

Figure 2:
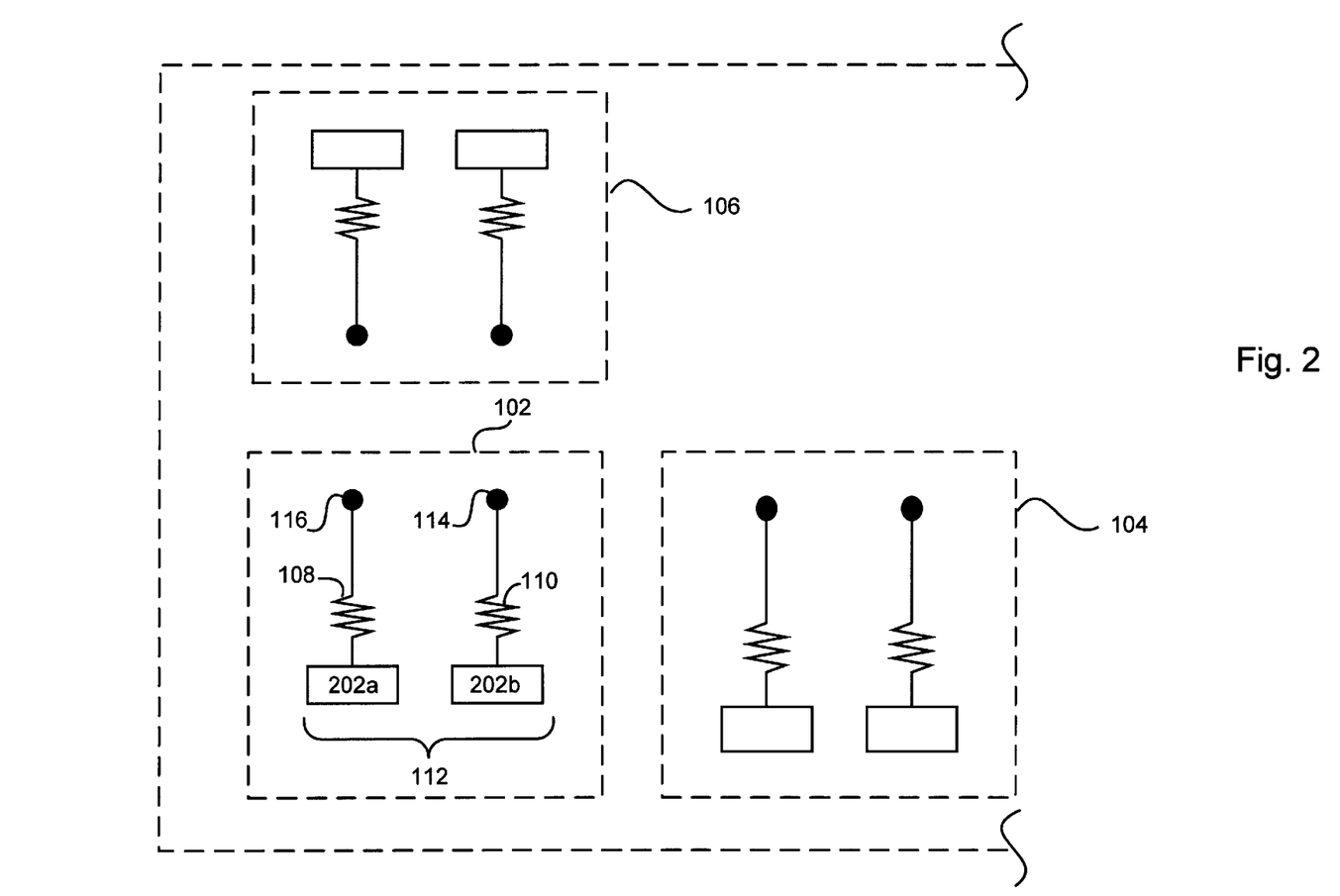
FIG. 2 shows, in accordance with one aspect of the present invention, the layout of resistors of a resistor network, including the adjacent bonding pads of the resistors.

To further illustrate FIG. 2 shows, in accordance with one aspect of the present invention, the layout of resistors 108 and 110 of resistor network 102. In FIG. 2, input terminal 112 is implemented by adjacent bonding pads 202(a) and 202(b). Adjacent bonding pads 202(a) and 202(b) are laid out such that they may be formed as part of the metal etch process. Subsequently, the resist layer that underlies the metal layer is etched to complete the formation of gap 204. Accordingly, the resistors of resistor network 102 become electrically disconnected at their common bonding area, thereby allowing each of resistors 108 and 110 to be individually measured without being influenced by the resistance value of the other.

Once measurements are taken (and appropriate additional processing steps such as a laser trimming are performed, if desired, to bring resistors 108 and 110 within the required tolerance limits), adjacent bonding pads 202(a) and 202(b) may be shorted together by a single bonding connection that straddle adjacent bonding pads 202(a) and 202(b) across gap 204.

Figure 3:
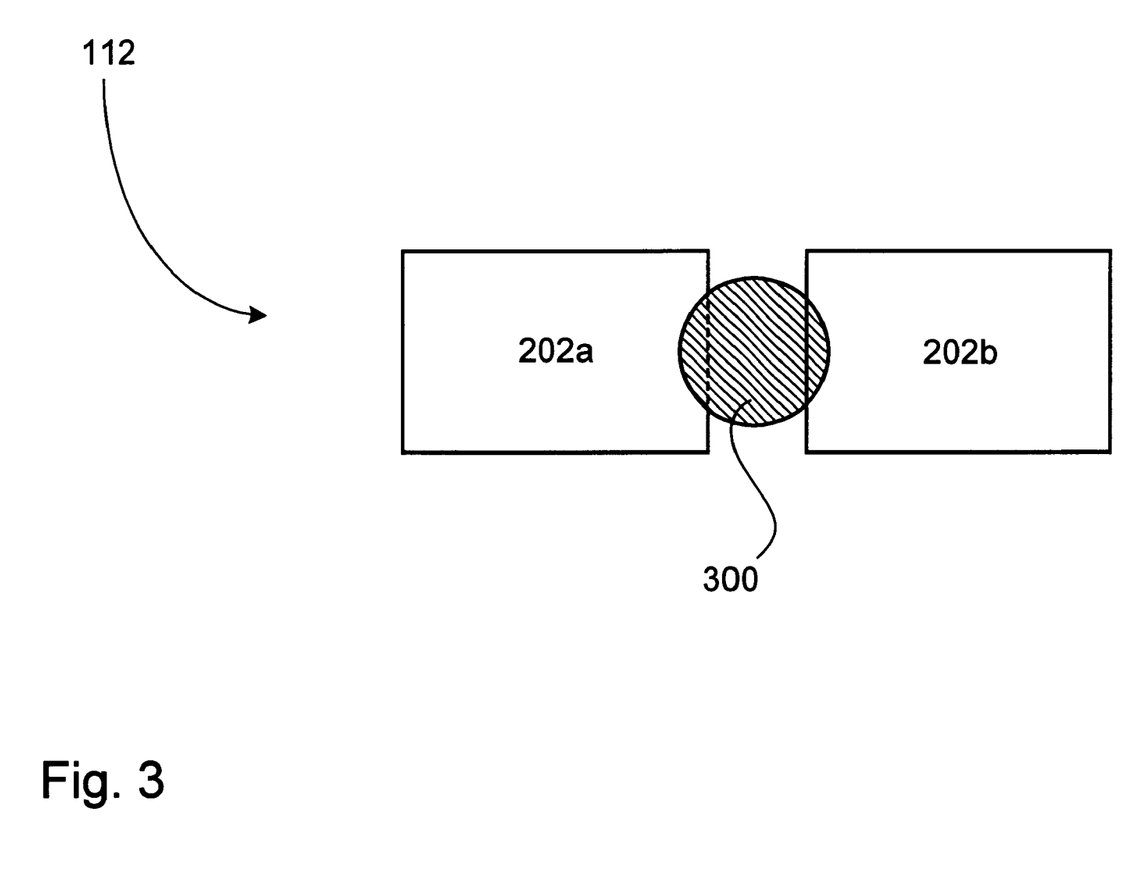
FIG. 3 shows, in accordance with one aspect of the present invention, a bonding connection that is appropriately sized and placed relative to the adjacent bonding pads and to the gap that electrically isolates the adjacent bonding pads from one another.

In one embodiment, gap 204 is about 5 microns wide. For the purposes of the present invention, however, the gap (e.g., gap 204) may be of any size with the caveat that it should be sufficiently small relative to the bonding connection employed so that adjacent bonding pads may be shorted together during bonding with a single bonding connection. To further illustrate, FIG. 3 shows bonding connection 300, which represents the bonding connection at one end of a bonding wire (not shown). Bonding connection 300 is shown bonded to adjacent bonding pads 202(a) and 202(b) of FIG. 2 to fulfill both its traditional role of providing an electrical path to the devices (e.g., to input terminal 112 of resistor network 102) and of shorting together across gap 204 adjacent bonding pads 202(a) and 202(b) of thin film resistors 108 and 110.

In one embodiment, the bonding connection to the adjacent bonding pads represents a conventional ball bond, such as a gold ball bond. As can be appreciated by those skilled in the art, such a ball bond comprises a ball at one end of a bonding wire, which may be attached in the present invention to one or more bonding pads to achieve an electrical connection thereto. Of course the bonding connection may be achieved by any other suitable technique for bonding a bonding wire to one or more bonding pads such as wedge bonding, ultrasonic bonding, and the like. If desired, the bonding wire may be laid across or at an angle to the gap itself to maximize the ability of the thin bonding wire to short adjacent bonding pads together across the gap. The bonding connection itself may be formed of gold, aluminum, or any other suitable bonding material.

Adjacent bonding pads of devices that need to be measured individually during manufacturing but are required to be coupled together in the final circuit may be laid out in any adjacent relationship that facilitates the interconnection of their respective devices using a single bonding connection. For example, previously discussed FIG. 2 shows adjacent bonding pads 202(a) and 202(b) of resistors 108 and 110 being laid out side-by-side and separated by vertical gap 204. For ease of access to the pins of the IC package, other resistor networks may be disposed adjacent to resistor network 102 to form a row (as in the case of resistor network 104) and/or disposed opposite to resistor network 102 to form a column (as in the case of resistor network 106). When the resistor networks are laid out in this manner, their adjacent bonding pads are located proximally to the pins of the IC package, thereby minimizing the length of the bonding wires required to couple groups of adjacent bonding pads to the IC pin.

Figure 4:
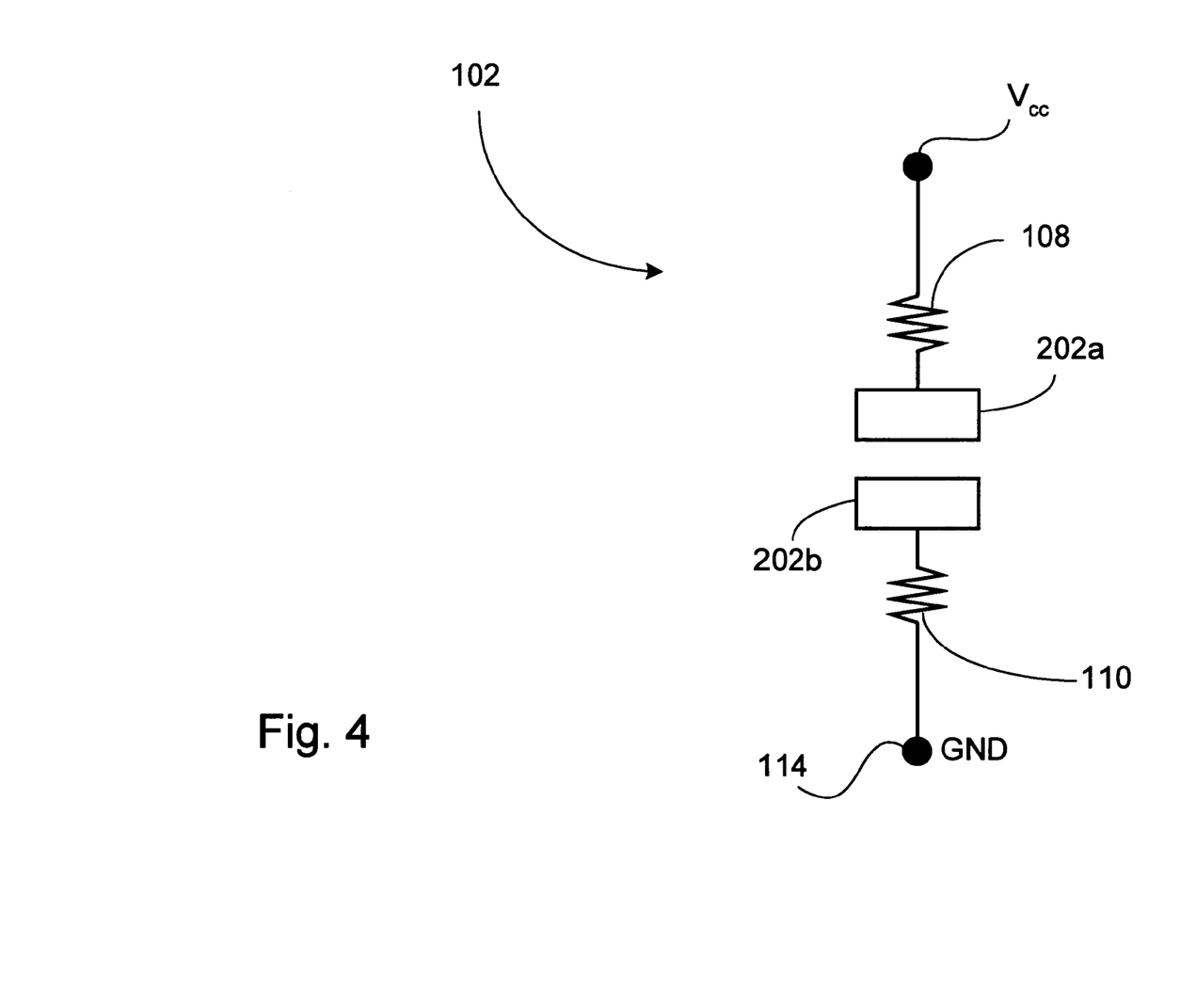
FIG. 4 illustrates, in accordance with one embodiment of the present invention, an alternative layout for a resistor network.

Of course other layout arrangements may well be employed. For example, FIG. 4 illustrates, in accordance with one embodiment of the present invention, an alternative layout for resistor network 102 of FIG. 1. In the layout of FIG. 4, the bonding pads of resistors 108 and 110 are laid out adjacent to one another in the vertical direction with a horizontal gap electrically isolating resistor 108 from resistor 110. If more than two bonding pads are involved, the bonding pads may be laid out in a radial orientation, for example, such that a single bonding connection made to the center of the radially arranged group of bonding pads can electrically couple them together. Further, any other layout arrangement may be employed as long as the bonding pads of devices that need to be coupled together in the final circuit are disposed such that they may be electrically coupled together by a single bonding connection. For measurement purposes, it may be desirable to design the bonding pads such that each bonding pad can accommodate a test probe. The bonding pads themselves may have any reasonable size and do not have to be uniform in size.

Figure 5:
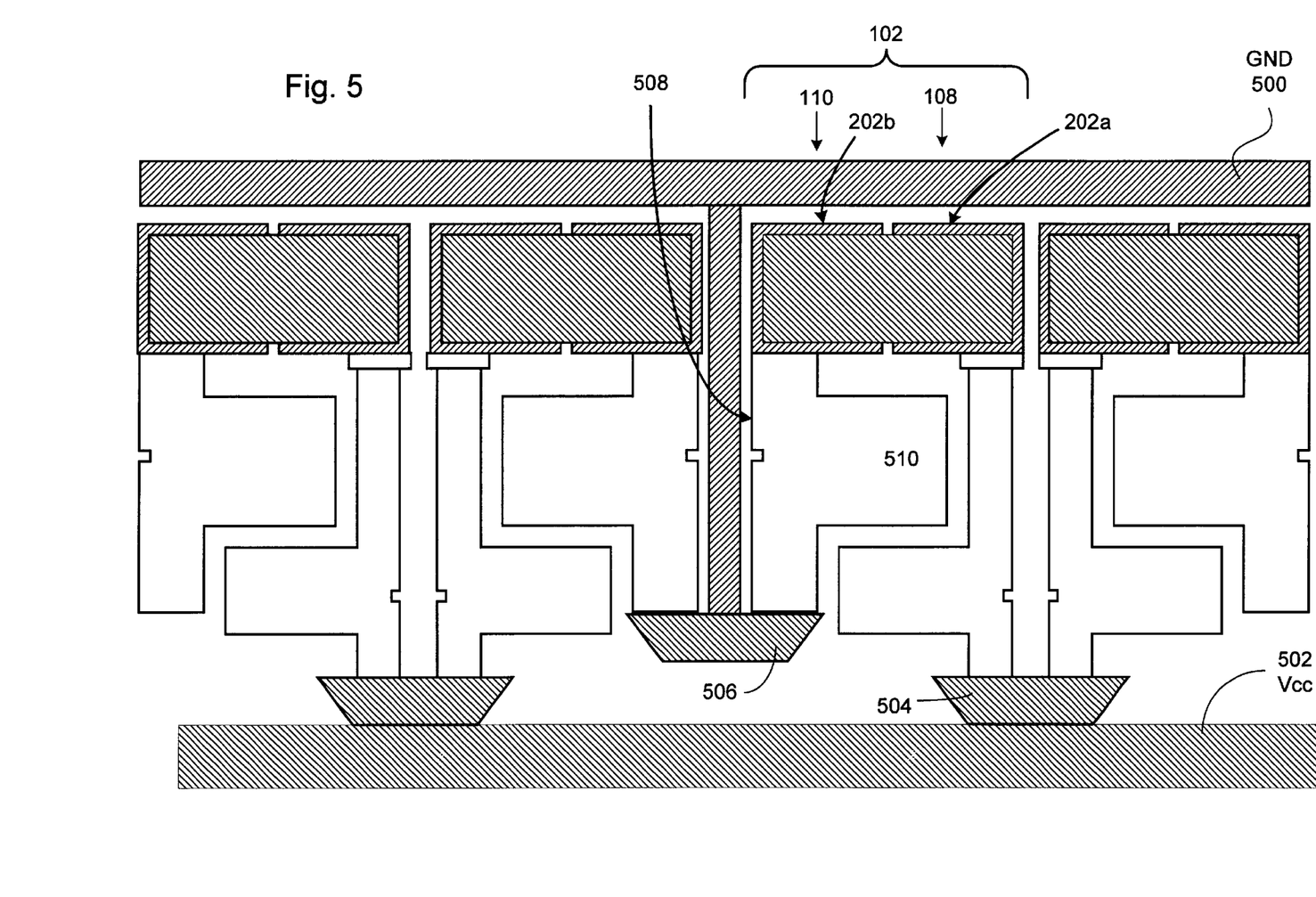
FIG. 5 illustrates, in accordance with one embodiment of the present invention, a simplified layout of an IC implementing 18 Thevenin Equivalent Terminator resistor networks.

FIG. 5 illustrates, in accordance with one embodiment of the present invention, a simplified layout of an IC implementing 18 Thevenin Equivalent Terminator resistor networks. In FIG. 5, a ground bus 500 is shown encircling two rows of thin-film resistors. A Vcc bus 502 is disposed between the two rows of resistors to provide Vcc thereto. Resistor network 102 of FIG. 2, representing one of the 18 resistor networks of the IC of FIG. 5, is also shown, along with its constituent thin-film resistors 110 and 108. Vcc is supplied to resistor network 102 at the location indicated by reference numeral 504, wherein ground is supplied to resistor network 102 at the location indicated by reference numeral 506.

In the implementation of FIG. 5, each of thin film resistors 108 and 110 has a main resistive body formed of a resistive material. The resistive body itself may be formed from a layer of suitable resistive material such as tantalum nitride (TaN), polysilicon, or the like. With reference to resistor 110, for example, resistive body 508 includes a tab portion 510. As mentioned earlier, the resistors are typically fabricated with a lower resistance value than that specified to account for inaccuracies in the fabrication process. The lower resistance is achieved by providing a large tab portion 510, which presents a large cross-sectional area through which current may flow, thereby reducing the resistance value of resistor 110.

During wafer sort, the resistance value of each resistor, e.g., resistor 110, may now be individually measured. Since resistor 110 is electrically disconnected from resistor 108, its resistance value may be accurately measured at wafer sort. The difference in the measured resistance value of resistor 110 and its specified resistance value determines the amount of resistive material that must be trimmed away from tab portion 510. By reducing the size of tab portion 510, the cross-sectional area through which current flows is reduced, thereby increasing the resistance value of resistor 110 to bring it within the required tolerance limit.

Figure 6:
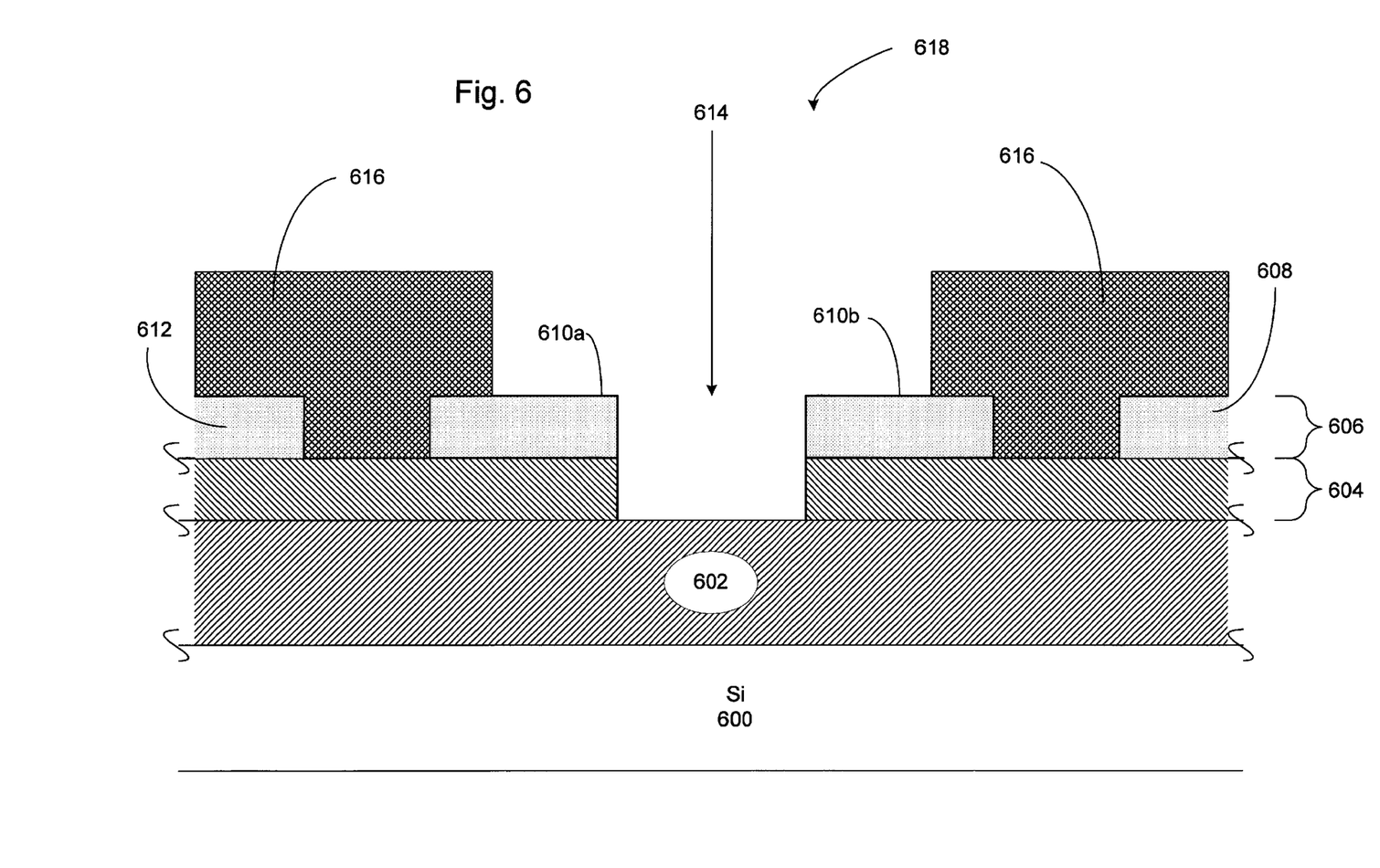
FIG. 6 illustrates, in accordance with one embodiment of the present invention, a cross-sectional view of a portion of a layer stack for implementing a resistor network.

FIG. 6 illustrates, in accordance with one embodiment of the present invention, a cross-sectional view of a portion of a layer stack for implementing a resistor network, e.g., resistor network 102 of FIG. 5. In FIG. 6, a layer of oxide 602 is first grown over a substrate 600, which is typically formed of silicon. A resistive layer 604, e.g., tantalum nitride, is next deposited on top of oxide layer 602.

Metal layer 606 is then deposited and etched back to form the first part of gap 614 and the interconnect structures, e.g., the bonding pads of the resistors, the Vcc and ground buses, and the like. In FIG. 6, these interconnect structures are shown as ground bus 608, adjacent bonding pads 610(a) and 610(b), and Vcc bus 612. Resistive layer 604 is then etched to create the resistors and to electrically isolate bonding pads 610(a) and 610(b) from one another. A dielectric layer 616 is then deposited and etched back to present a window 618 therein to permit a bonding connection to be made to adjacent bonding pads 610(a) and 610(b). As discussed earlier, this single bonding connection (shown in FIG. 3) is employed to simultaneously short adjacent bonding pads 610(a) and 610(b) together and to provide an electrical path thereto after the resistors are measured.

It is contemplated that the inventive IC structures and manufacturing techniques disclosed herein may be adapted to wide variety of IC circuits. The individual devices, being electrically isolated from each other after fabrication, may be accurately measured prior to bonding. By appropriately sizing and placing the bonding connection, the electrically isolated connection pads of the individual devices may then be shorted together and coupled to a bonding lead in a single bonding step, thereby significantly reducing manufacturing complexity and costs.

In accordance with one aspect of the invention, any circuit in which the accurate measurement of its constituent devices is required may be fabricated using the technique disclosed herein. The devices themselves may represent any passive or active electrical devices, including resistors, capacitors, inductors, transistors, or the like. By way of example, the inventive technique may be employed to fabricate an operational amplifier IC in which its feed-back resistors are electrically isolated for measurement and adjustment prior to bonding. As another example, resistors in a bias network of a voltage regulator may be similarly fabricated such that they are electrically isolated from one another to enable accurate measurement and adjustment prior to bonding. Other circuits that are also suitable for use with the inventive technique disclosed herein are not listed here so as not to unnecessarily burden this disclosure with details and applications readily appreciated by those skilled in the art and in possession of the present disclosure.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for utilizing an integrated circuit structure having a substrate, a first circuit structure formed on the substrate, the first circuit structure comprising a first tab portion, a first conductive bonding pad coupled to the first circuit structure, the first conductive bonding pad comprising a first portion of a conductive layer formed on the substrate, a second circuit structure formed on the substrate, the second circuit structure comprising a second tab portion, a second conductive bonding pad coupled to the second circuit structure, the second conductive bonding pad comprising a second portion of the conductive layer, the first conductive bonding pad being separated from the second conductive bonding pad by a gap between the first portion of the conductive layer and the second portion of the conductive layer, the method comprising:

measuring the first circuit structure via the first conductive bonding pad;

adjusting the measured value, if needed, by trimming the first tab;

measuring the second circuit structure via the second conductive bonding pad;

adjusting the measured value, if needed, by trimming the second tab; and connecting the gap between the circuit structures with a wire bond after the measurements and adjustments are made to the tabbed portions in order to provide for independent testing and adjustment of each separate circuit, the wire bond being bonded to the first conductive bonding pad and to the second conductive bonding pad at the gap to form a terminal on the substrate.

2. The method of claim 1 which further includes extending the gap through the conductive layer.

3. The method of claim 2 wherein the first circuit structure further comprises a thin-film resistor having a resistive portion, and the method for utilizing the structure includes coupling this resistive portion to the first conductive bonding pad, and forming the resistive portion from a resistive layer disposed below at least a portion of the conductive layer.

4. The method of claim 1 which further includes extending the gap through both the conductive layer and the resistive layer.

5. The method of claim 4 which further includes forming the gap dimension to be between a first dimension and about five microns, the first dimension representing a gap distance sufficient to electrically isolate the first conductive bonding pad and the second conductive bonding pad before the wire bond is coupled to the first conductive bonding pad and the second conductive bonding pad.

6. The method of claim 1 which further includes forming the wire bond as a ball bond.

7. An apparatus for utilizing an integrated circuit structure having a substrate, a first circuit structure formed on the substrate, the first circuit structure comprising a first tab portion, a first conductive bonding pad coupled to the first circuit structure, the first conductive bonding pad comprising a first portion of a conductive layer formed on the substrate, a second circuit structure formed on the substrate, the second circuit structure comprising a second tab portion, a second conductive bonding pad coupled to the second circuit structure, the second conductive bonding pad comprising a second portion of the conductive layer, the first conductive bonding pad being separated from the second conductive bonding pad by a gap between the first portion of th conductive layer and the second portion of the conductive layer, comprising;

a means for measuring the first circuit structure via the first conductive bonding pad;

a means for adjusting the measured value, if needed, by trimming the first tab;

a means for measuring the second circuit structure via the second conductive bonding pad;

a means for adjusting the measured value, if needed, by trimming the second tab; and a means for connecting the gap between the circuit structures with a wire bond after the measurements and adjustments are made to the tabbed portions in order to provide for independent testing and adjustment of each separate circuit, the wire bond being bonded to the first conductive bonding pad and to the second conductive bonding pad at the gap to form a terminal on the substrate.

8. An apparatus as recited in claim 7, further comprising:
a means for extending the gap through the conductive layer.

9. An apparatus as recited in claim 8, wherein the first circuit structure further comprises a thin-film resistor having a resistive portion.

10. An apparatus as recited in claim 9, further comprising:
a means for forming the resistive portion of the thin film resistor from a resistive layer disposed below at least a portion of the conductive layer.

11. An apparatus as recited in claim 9, further comprising:
a means for coupling the resistive portion of the thin film resistor to the first conductive bonding pad.

12. An apparatus as recited in claim 7, further comprising:
a means for extending the gap through both the conductive layer and the resistive layer.

13. An apparatus as recited in claim 10, wherein the means for forming the gap forms a gap dimension to be between a first dimension and about five microns, wherein the first dimension represents a gap distance sufficient to electrically isolate the first conductive bonding pad and the second conductive bonding pad before the wire bond is coupled to the first conductive bonding pad and the second conductive bonding pad.

14. An apparatus as recited in claim 7, wherein the wire bond is a ball bond.

* * * * *